United States Patent [19]

Schleinkofer et al.

[11] Patent Number: 4,870,350
[45] Date of Patent: Sep. 26, 1989

[54] ELECTRICAL SIGNAL OBSERVING DEVICE

[75] Inventors: Ludwig Schleinkofer, Herrsching am Ammersee, Fed. Rep. of Germany; Yutaka Tsuchiya, Shizuoka, Japan

[73] Assignee: Hamamatsu Photonics Kabushiki Kaisha, Shizuoka, Japan

[21] Appl. No.: 135,446

[22] Filed: Dec. 21, 1987

[30] Foreign Application Priority Data

Dec. 23, 1986 [JP] Japan .................. 61-307371

[51] Int. Cl.4 ..................... G01R 13/20; G01N 21/64; H04N 5/30
[52] U.S. Cl. ........................ 324/121 R; 324/158 R; 324/158 D; 250/213 VT; 356/318
[58] Field of Search .......... 324/158 D, 158 R, 121 R; 356/121, 318; 250/213 VT; 313/528, 529

[56] References Cited

U.S. PATENT DOCUMENTS

| | | | |
|---|---|---|---|
| 3,905,704 | 9/1975 | Mitsui et al. | 356/121 X |
| 4,344,707 | 8/1982 | Massie | 356/121 X |
| 4,472,053 | 9/1984 | Wyatt et al. | 356/121 X |
| 4,661,694 | 4/1987 | Corcoran | 250/213 VT X |
| 4,670,710 | 6/1987 | Beha et al. | 324/158 D |
| 4,718,761 | 1/1988 | Tsuchiya | 250/213 VT |
| 4,727,427 | 2/1988 | Kime | 250/213 VT X |
| 4,734,573 | 3/1988 | Dill | 250/213 VT X |
| 4,740,685 | 4/1988 | Koishi | 250/213 VT X |

Primary Examiner—Reinhard J. Eisenzopf
Assistant Examiner—Vinh P. Nguyen
Attorney, Agent, or Firm—Finnegan, Henderson, Farabow, Garrett, & Dunner

[57] ABSTRACT

An electrical signal measuring device for measuring with high time resolution a relatively long optical phenomenon representing the electrical signal. A linear array of laser diodes is provided with an electrical signal and a slit image of the diodes is imaged on a photocathode of a streak tube in a direction perpendicular to the direction of its sweep. The electrical signal is subdivided into a plurality of subcycles equal in number to the number of diodes such that a visual array including m×n elements is operated corresponding to m cycles of the electrical signal with each cycle having n subcycles.

22 Claims, 7 Drawing Sheets

ELECTRICAL SIGNAL OBSERVING DEVICE

FIELD OF THE INVENTION

This invention relates to an electrical signal measuring device for observing an electrical signal that changes at considerably high speed.

BACKGROUND OF THE INVENTION

A high speed oscilloscope is one example of means for measuring the waveform or the like of an electrical signal that changes at high speed. The response time (or time resolution) of the high speed oscilloscope is of the order of one nano-second ($10^{-9}$ second). On the other hand, the time resolution of a sampling type oscilloscope is of the order of thirty pico-seconds. It should be noted, however, that the sampling type oscilloscope can measure only repetitive phenomena.

It is well known in the art that an ultra-high speed streak camera can measure a light emitting phenomenon that changes at extremely high speed. The streak camera has a time resolution of the order of pico-seconds or better, and is generally used to measure optical signals. When an element for converting an electrical signal into an optical signal, such as a laser diode, is provided in front of the streak camera, then an electrical signal can be measured with a time resolution in the range of nano-seconds to several pico-seconds which is higher than that in the case of the above-described oscilloscope.

The operating principle of an electrical signal measuring method using a streak camera will be described with reference to FIG. 1.

An optical signal is formed with an intensity that is proportional to or in a relation of 1:1 with an electrical signal to be measured. The optical signal is converted into a streak image by means of a streak tube, for measurement of the electrical signal.

A laser diode 901 is driven by the electrical signal to be measured, and emits a light beam. The light beam is applied to a slit plate 902 in an input optical system. The slit image of the slit plate 902 is formed on a photocathode 910 of a streak tube 900.

At the photocathode 910, the slit image is converted into an electronic image, which is accelerated by an accelerating electrode 911 and focused to enter a deflection field.

In the deflection field, a pair of deflection plates 912A and 912B are provided. When the electronic image passes through the deflection field, a high speed sweep voltage is applied to the deflection plates by a sweep voltage generating circuit 915 so that the electronic image sweeps downwardly. This sweep should be synchronous with the passage of the electronic image. For this purpose, an electrical signal formed from a part of the incident light beam, or a part of the electrical signal to be measured is utilized as a trigger signal.

In a single sweep streak camera, the high speed sweep voltage is similar in waveform to a saw-tooth wave, and therefore the sweep repetition is limited to a maximum of several kilo-hertz (KHz). In a synchro scan streak camera, the sweep voltage is a sine wave synchronous with an electrical signal to be measured which is high in repetition, and the sweep frequency is 75 to 165 MHz.

When the light emission of the laser diode 901 is synchronous with the sweep waveform, a streak image is formed on a phosphor screen 914 at the same position with high repetition. The streak image is integrated, so that the weak optical phenomenon can be measured with high S/N ratio in a short time. The electronic image, after being electron-multiplied by a factor of about 1000 when passed through a micro-channel plate 913, is applied to the phosphor screen 914, where it is converted into an optical image. For analysis, the streak image thus formed is picked up through a relay lens (not shown) with an SIT camera.

The position of the streak image on the phosphor screen 914 depends on when the electrons formed by the incident light beam are emitted from the photocathode 910. that is, the time axis of the incident light beam is converted into the vertical axis of the phosphor screen 914. Accordingly, the time difference can be detected from the position of the streak image on the vertical axis of the phosphor screen 914, and the optical intensity from the density of the image.

The data, in the slit direction, of the slit image on the photocathode 910 remain, as they are, in the streak image in the direction of the horizontal axis. Therefore, with an image-forming system or spectroscope arranged in front of the streak tube 900, the variations of the optical intensity with respect to positions and wavelengths can be measured.

FIG. 2 shows the variations of the data included in the streak image in the horizontal axis and the streak image.

In the above-described measuring method using the streak camera, the time resolution is proportional to the time period for which the observation is permitted (hereinafter referred to as "an observation time period," when applicable). Therefore, as the time resolution is increased, the observation time period is decreased. In an ordinary streak camera, the relation between the time resolution and the observation time period is as follows:

(observation time period) = 200 × (time resolution)

For instance when the time resolution is two pico-seconds, then the observation time period is:

$2 \times 10^{-12} \times 200 = 4 \times 10^{-10} = 0.4$ nano-second

Accordingly, it is impossible for only one measurement (sweep) to achieve the measurement of a relatively long optical phenomenon with high time resolution.

In the case of an ultra-high speed IC or ultrahigh speed logic circuit, it is necessary to measure a relatively long time period with high time resolution to measure the timing of the operations thereof and of various pulses. Furthermore, it is necessary to use means for instantaneously recording and analyzing the waveforms of the pulses.

OBJECTS AND SUMMARY OF THE INVENTION

An object of the present invention is an electrical signal measuring device for measuring a relatively long optical phenomenon with high time resolution.

Another object of the present invention is an electrical signal measuring device for instantaneously recording and analyzing the waveforms of pulses.

A further object of the present invention is an electrical signal measuring device for use in measuring and testing the performance of ultra-high speed integrated circuits and ultra-high speed logic circuits.

The foregoing objects of the present invention are achieved by an electrical signal observing device comprising a light emitting element group including a plurality of light emitting elements, electrical signal connecting means for connecting an electrical signal to the light emitting elements in the light emitting element group for a period of time for measurement in such a manner that the electrical signal is time-divided into a plurality of cycles of electrical signal, and each cycle of the electrical signal is further time-divided into a plurality of electrical signal parts equal in number to the light emitting elements in the light emitting element group and being successively applied to respective ones of the light emitting elements. A streak camera performs a sweep operation with a sweep time corresponding to the period of time for measurement, and emitted-light connecting means arranges the outputs of the light emitting elements of the light emitting element group in each cycle of light emission in a direction perpendicular to the direction of sweep of the streak camera.

The manner by which the above objects and other objects, features, and advantages of the present invention are attained will be fully apparent from the following detailed description when it is considered in view of the drawings, wherein.

Figure 6A:
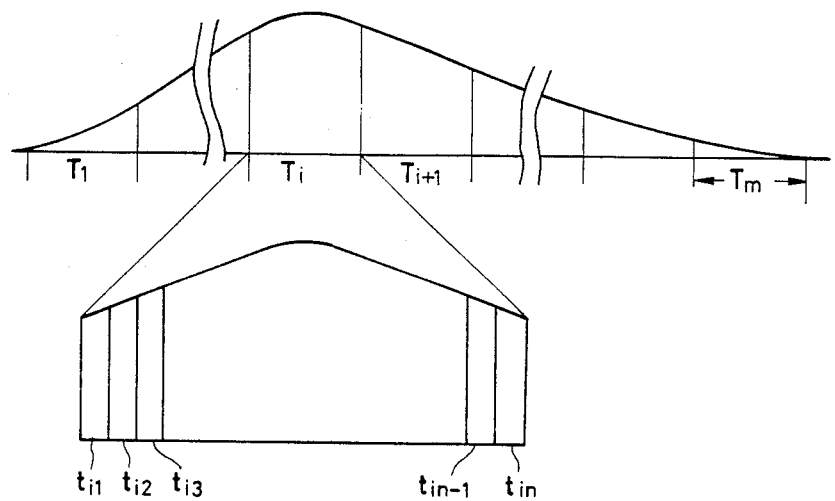
Figure 6B:
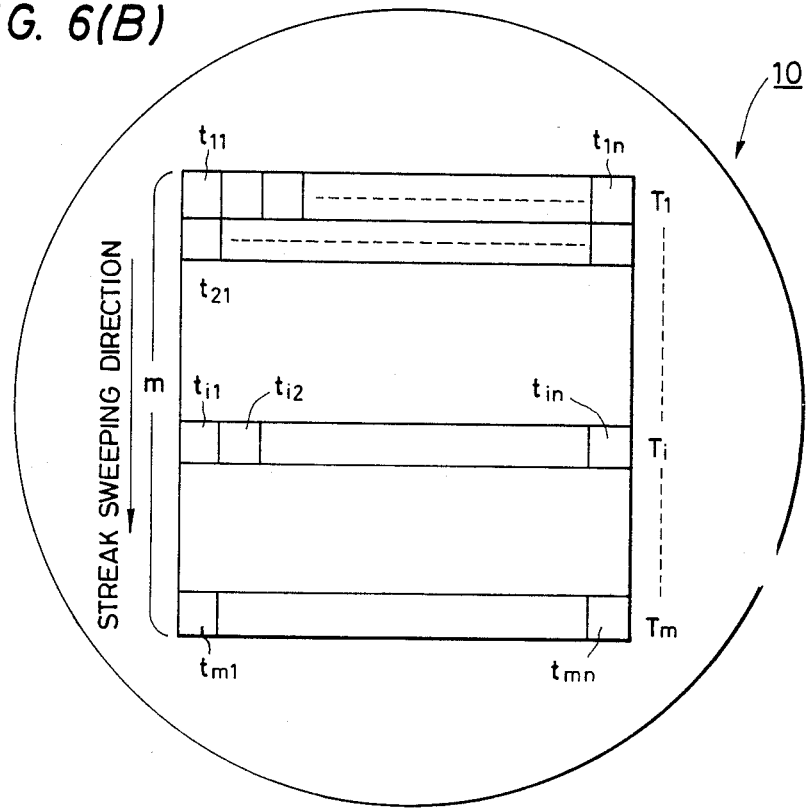
Figure 7:
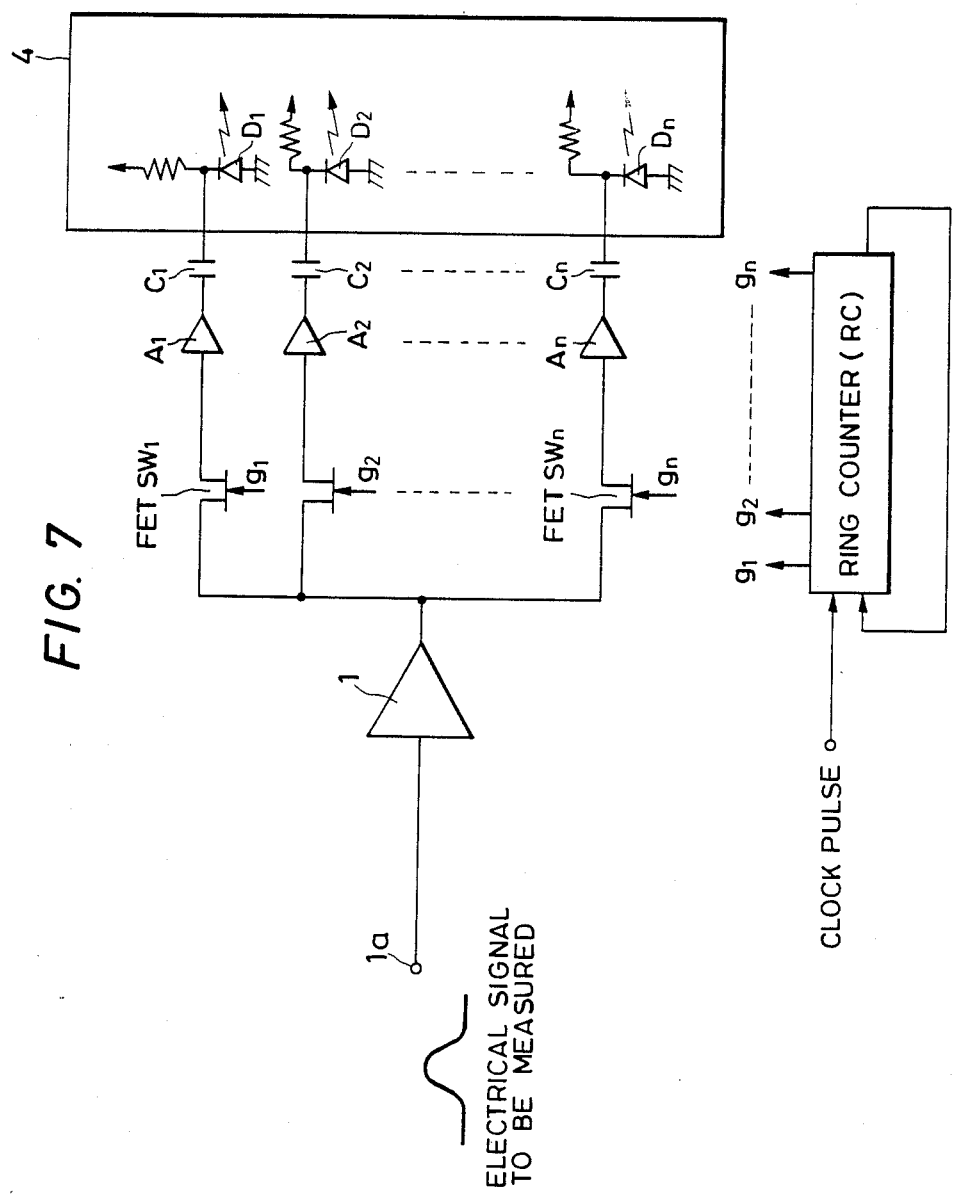
Figure 8:
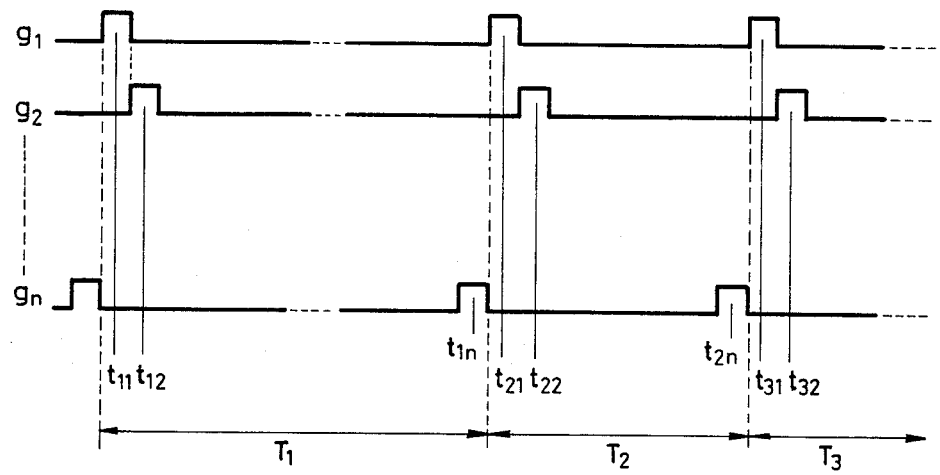
Figure 9:
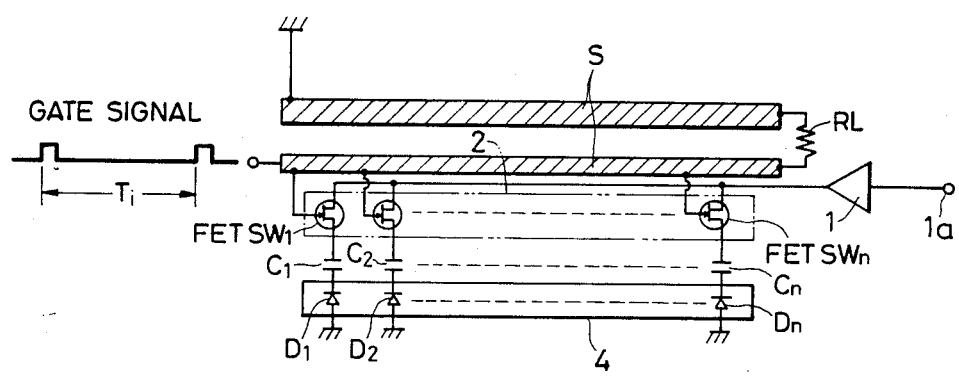
Figure 10:
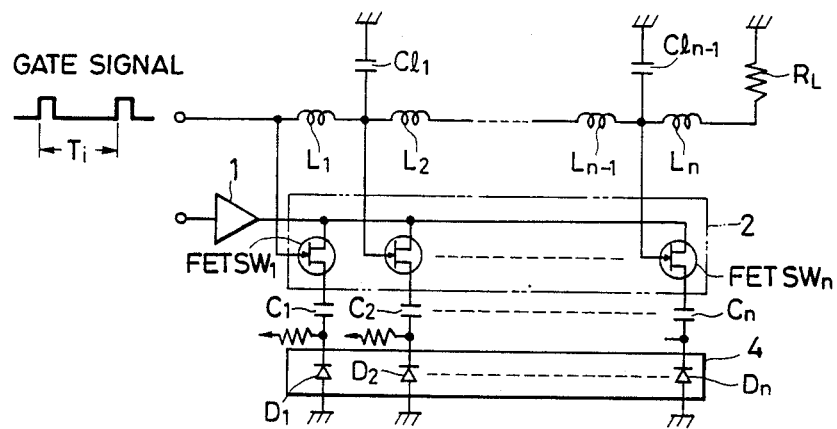
Figure 11:
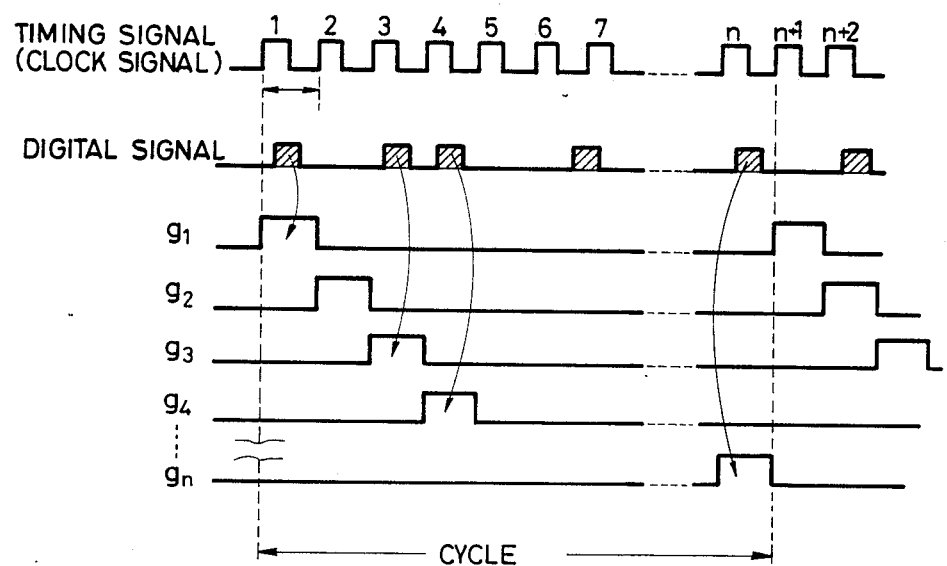
Figure 12:
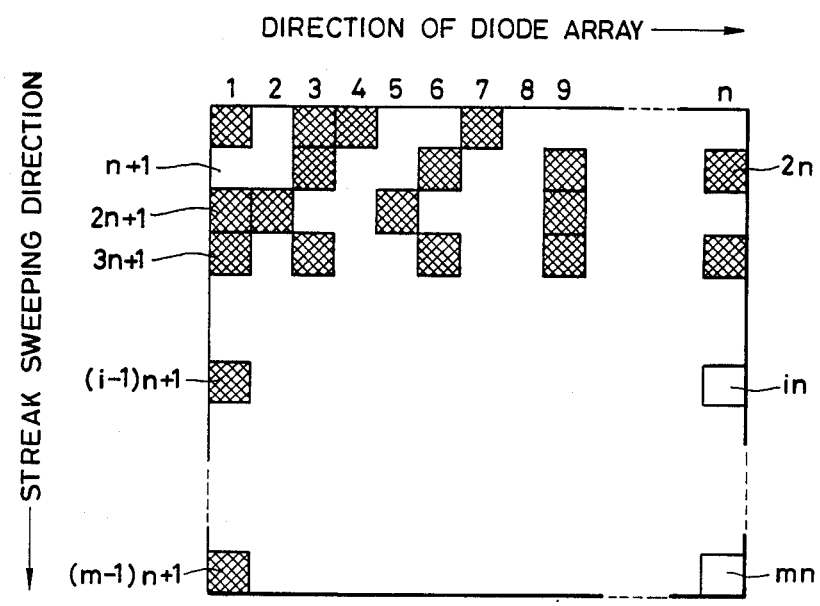

FIGS. 6(A) and 6(B) are explanatory diagrams showing the relation between the waveform (A) of an electrical signal to be measured and the phosphor screen (B) of a streak tube;

FIG. 7 is a block diagram showing another example of the light emitting element group and another example of an electrical signal connecting means for use in the electrical signal observing device according to the present invention;

FIG. 8 is a waveform diagram showing voltages at the output terminals of a ring counter RC in FIG. 7;

FIG. 9 is a block diagram showing another example of the light emitting element group and another example of the electrical signal connecting means for use in the electrical signal observing device according to the present invention;

FIG. 10 is a block diagram showing another example of the light emitting element group and electrical signal connecting means for use in the electrical signal observing device of the invention;

FIG. 11 is a time chart showing clock pulses, digital signals, and gate signals in the case where the electrical signal observing device of the present invention is used for observation of digital signals and;

FIG. 12 is an explanatory diagram showing the arrangement of digital signals on the phosphor screen of a streak tube;

DETAILED DESCRIPTION OF THE INVENTION

Figure 1:
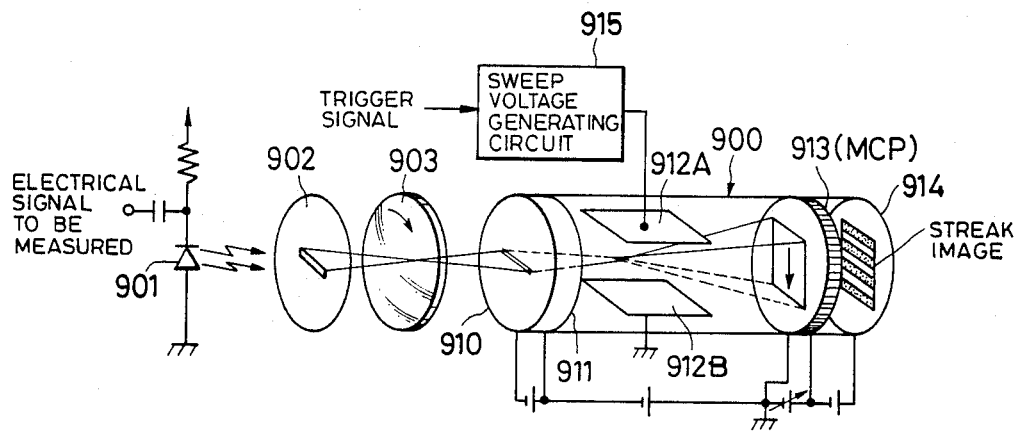
FIG. 1 is a perspective view for a description of the operating principle of a streak camera.
Figure 2:
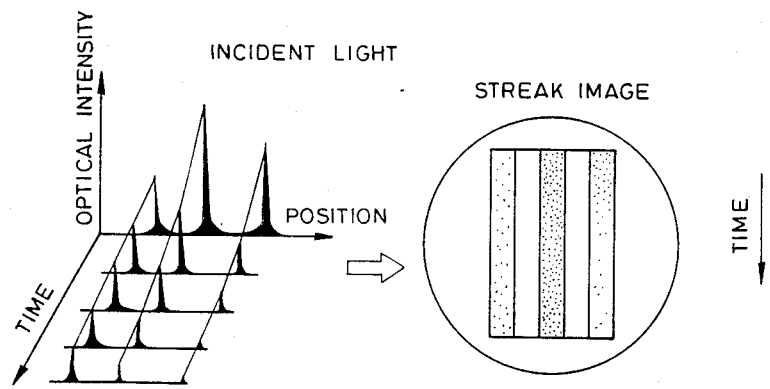
FIG. 2 is an explanatory diagram showing a streak image with the variations of data included in the streak image in the horizontal direction.
Figure 3:
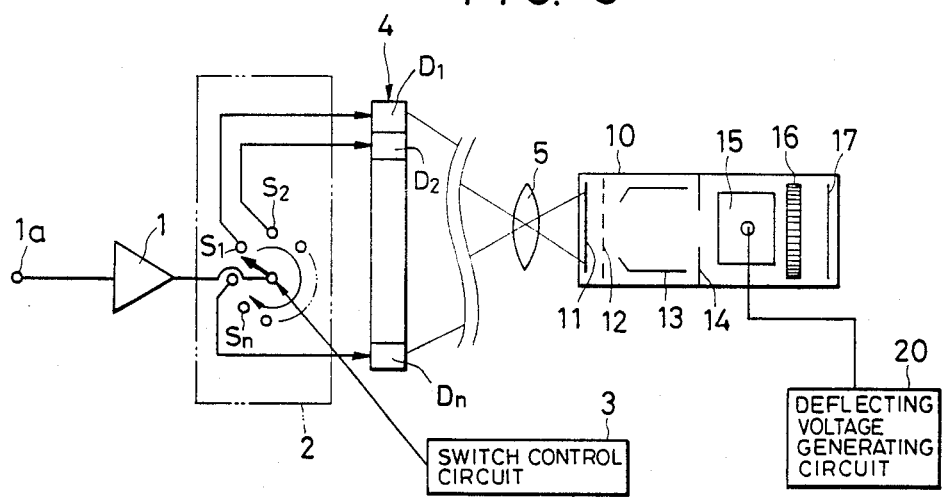
FIG. 3 is a block diagram showing one example of an electrical signal observing device according to the present invention.

FIG. 3 is a block diagram showing a first example of an electrical signal observing device according to the invention.

A signal to be measured is applied to the input terminal 1a of an amplifier 1 included in an electrical signal controlling means. The output of the amplifier 1 is connected to a change-over switch 2 which is operated by switch control means 3 so that its armature is connected successively and repeatedly to diodes $D_1$, $D_2$, ... and $D_n$ in a laser diode array 4.

In the laser diode array 4, the diodes $D_1$, $D_2$, ... and $D_n$ are arranged in a straight line. The optical outputs of the diodes $D_1$ through $D_n$ are focused by means of emitted-light coupling means such as a lens or the like to the photocathode 11 of a streak tube 10 in a streak camera in such a manner that they are arranged in a direction perpendicular to the sweep direction. In this case, it is preferable that the image of the optical outputs of the diodes arranged in a line is formed like a slit on the photocathode 11.

Figure 4:
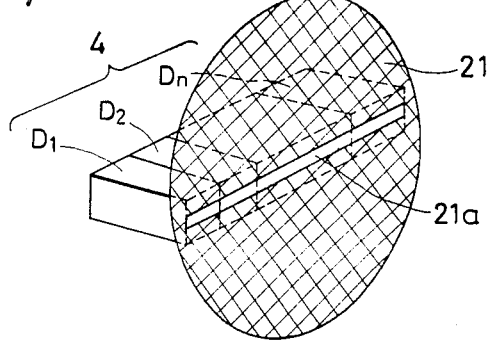
FIG. 4 is a perspective view showing one example of a photo-diode array for use in the electrical signal observing device.

FIG. 4 is a perspective view showing one example of the arrangement of the diodes.

In the laser diode array 4, the diodes $D_1$ through $D_n$ are arranged side by side in such a manner that they are in close contact with one another. A slit plate 21 having a slit 21a is arranged in front of the laser diode array 4, so that only the light beam passing through the slit 21a is focused in the form of a slit to the photocathode 11 of the streak tube 10 by means of the lens 5 shown in FIG. 3. The slit plate 21 may be disposed immediately before the photocathode 11 of the streak tube 10.

Figure 5:
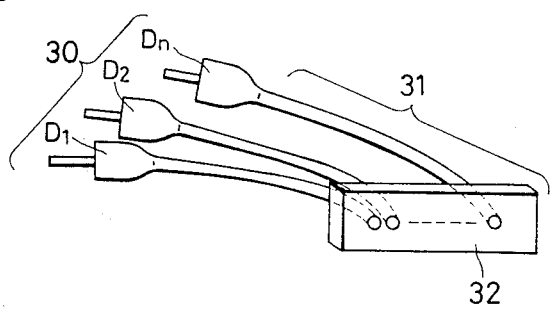
FIG. 5 is a perspective view showing another example of a light emitting element group and another example of an emitted-light connecting means for use in the electrical signal observing device according to the present invention.

FIG. 5 is a perspective view showing another example of the light emitting element group and another example of the emitted-light coupling means in the electrical signal observing device according to the invention. As shown in, FIG. 5, it is not always necessary to arrange the light emitting elements in a row as described above. That is, the light emitting element group 30 may be made up of optical fiber output type diodes $D_1$, $D_2$, ... $D_n$. In this case, the output ends of the fibers 31 are arranged in a straight line with an aligning board 32 which is confronted with the photocathode 11 of the streak tube 10.

Referring to FIG. 3, the photoelectrons emitted from the photocathode 11 are accelerated by an accelerating electrode 12 and focused by a focusing electrode 13, so that they are caused to enter the deflection field through an aperture electrode 14.

The deflection field is formed by deflection electrodes 15 to which a deflecting voltage is applied by a deflecting voltage generating circuit 20. Therefore, the photoelectrons are deflected when passing through the deflection field. The deflected photoelectrons are applied to a microchannel plate 16, where they are subjected to electron multiplication. The emitted photoelectrons thus multiplied are applied to a phosphor screen 17 to cause the screen 17 to emit light.

The operation of the above-described electrical signal measuring device of the invention will be described with reference to FIGS. 6(A) and 6(B).

FIG. 6(A) is a waveform diagram showing one example of an electrical signal to be measured, and FIG. 6(B) is a diagram showing the relation between the electrical signal and the light emission position of the phosphor screen 17 of the streak tube 10.

For simplification in description, it is assumed that as shown in the FIG. 6(A), an electrical signal is measured for a period of time $\Sigma T_i$ (i=1 to m). For the period of the first cycle $T_1 = \Sigma t_{1j}$ (j=1 to n), the switch 2 connects the parts of the output of the amplifier 1, which correspond to time slots $t_{11}$, $t_{12}$, $t_{13}$, ... and $t_{1n}$, respectively, successively to the diodes $D_1$, $D_2$, ... and $D_n$, so that these diodes are turned on to emit luminances corresponding to the parts of the output of the amplifier, respectively.

Similarly, for the period of the second cycle $T_2 = \Sigma t_{2j}$ (j=1 to n), the switch 2 connects the parts of the output of the amplifier, which correspond to time slots $t_{21}$, $t_{22}$, $t_{23}$, ... and $t_{2n}$, respectively, successively to the diodes $D_1$, $D_2$, ... and $D_n$ in the laser diode array 4.

The period of time required for the switch 2 to achieve one cycle of distributive connection is much shorter than the sweep period of the streak tube 10, and therefore the signals appear as shown in the FIG. 6(B). that is, each cycle corresponds to a scanning line for n picture elements, and the cycles are obtained as n×m analog luminance data.

FIG. 7 is a block diagram showing another example of the electrical signal connecting means and another example of the light emitting element group. In the circuit of FIG. 7, a signal to be measured is applied to the input terminal 1a of an amplifier 1 and amplified. The output terminal of the amplifier 1 is connected to n ultra-high speed FET switches $FETSW_1$ through $FETSW_n$. The output of the switch $FETSW_1$ is amplified by an amplifier $A_1$ and is applied through a capacitor $C_1$ to a laser diode $D_1$. The output of the switch $FETSW_2$ is amplified by an amplifier $A_2$ and is applied through a capacitor $C_2$ to a laser diode $D_2$. Similarly, the output of the switch $FETSW_n$ is amplified by an amplifier $A_n$ and is applied through a capacitor $C_n$ to a laser diode $D_n$.

The gates of the FET switches $FETSW_1$ through $FETSW_n$ are connected to the output terminals $g_1$ through $g_n$ of a ring counter RC.

FIG. 8 is a waveform diagram showing voltages provided at the output terminals of the ring counter RC.

In response to the output terminal voltages $g_1$, $g_2$, ... and $g_n$ of the first group, the output of the amplifier 1 is connected to the diodes $D_1$, $D_2$, ... and $D_n$ in the laser diode array 4 for the time slots $t_{11}$, $t_{12}$, ... and $t_{1n}$, respectively; similarly, in response to the output terminal voltages $g_1$, $g_2$, ... and $g_n$ of the second group, the output of the amplifier 1 is applied to the diodes $D_1$, $D_2$, ... and $D_n$ in the laser diode array 4 for the time slots $t_{21}$, $t_{22}$, ... and $t_{2n}$, respectively; and so forth.

In the case where the switch operating speed is 500 pico seconds per change-over, and n=50, it requires 25 nano-seconds $(500 \times 10^{-12} \times 50 = 2.5 \times 10^{-8})$ to distribute the signals to the diodes $D_1$, $D_2$, ... and $D_n$ in the laser diode array 4. If the streak tube is swept in the manner of FIG. 6 (B), the time interval between the sweeping of the first line ($t_{11}$ through $t_{1n}$) and that of the second line ($t_{12}$ through $t_{2n}$) is 25 nano-seconds, then it will take 25×m nano-seconds for the vertical full-scale of the streak image. When m=100, the above-described value will be 2.5 micro-seconds.

In this case, the time resolution is 500 pico-seconds, and the observation time is 25 micro-seconds. The ratio of the observation time to the time resolution is $2.5 \times 10^{-6} / 500 \times 10^{-12} = 5 \times 10^3$.

In the above-described embodiment, the sweep of the streak camera 10 is a single sweep with a ramp voltage. However, in the case where the electrical signal to be measured changes repeatedly in the same manner, for instance in the case where the electrical signal has an analog or digital waveform that is repeated with a certain period, the sweep of the streak camera may be a high repetition sweep synchronous with the repetition of the waveform such as a triangular waveform, a sine waveform or the like.

In the circuit of FIG. 7, the amplifier 1, the FET switches $FETSW_1$ through $FETSW_n$ and the amplifiers $A_1$ through $A_n$ connected to the FET switches $FETSW_1$ through $FETSW_n$, respectively, which form the connecting means, may be provided in the form of an integrated circuit (IC) for miniaturization. Furthermore, they can be provided in the form of a GaAs IC for high speed operation. The GaAs IC may be combined with the laser diodes.

FIG. 9 is a block diagram showing another example of the light emitting element group and another example of the electrical signal connecting means. In FIG. 9, a circuit for applying bias current to the diodes in the laser diode array 4 is not shown for simplification in illustration.

The output terminal of an amplifier 1, which receives an input signal, is connected to the drains of n FET switches $FETSW_1$ through $FETSW_n$. The sources of the FET switches $FETSW_1$ through $FETSW_n$ are connected through capacitors $C_1$ through $C_n$ to laser diodes $D_1$ through $D_n$ in a laser diode array 4, respectively. Resistors connected between the ground and the sources of the FET switches are not shown in FIG. 9.

The gates of the FET switches $FETSW_1$ through $FETSW_n$ are connected to a strip conductor of a strip line S at equal intervals in the stated order. For non-reflection, a resistor RL is connected between the ends of the strip lines S.

A gate pulse signal is applied to the strip conductor of the strip line S to render the FET switches $FETSW_1$ through $FETSW_n$ conductive in the stated order.

In the gate pulse signal, the pulse interval is equal to the cycle period $T_i$ shown in FIG. 6. Therefore, the FET switches $FETSW_1$ through $FETSW_n$ are successively rendered conductive at the speed of propagation of the pulse signal in the strip line S, so that the output of the amplifier 1 is applied to the diodes $D_1$ through $D_n$ of the laser diode array 4 one after another.

FIG. 10 is a block diagram showing another example of the electrical signal connecting means and another example of the light emitting element group. The circuit of FIG. 10 can be obtained by employing a distributed constant circuit consisting of inductors $L_1$, $L_2$, $L_3$, ... and $L_n$ and capacitors $Cl_1$, $Cl_2$, ... and $Cl_n$ instead of the strip line S in FIG. 9.

In the circuits of FIGS. 9 and 10, the FETs may be replaced by switching elements that are controlled by an optical signal. In this case, the optical signal is employed as the gate signal shown in FIG. 8.

In a digital signal processing operation or a digital optical communication, a clock signal is employed as a fundamental signal in the system, and in many cases digital signals (binary signals) are provided in synchronization with the clock signal. In this case, increasing the clock frequency is important because it will increase the processing speed. However, if the clock frequency is set to higher than 1 GHz ($=10^9$ Hz), no observing or recording means is available.

The measurement of a digital signal in synchronization with a clock signal that is a fundamental signal in the system will be described.

FIG. 11 is a waveform diagram showing the relation between a digital signal (binary) transmitted in synchronization with a clock signal and switching operation. In FIG. 11, the second line shows the transmission of digital signals, for example 1011001 ... 1, in response to the first through n-th clock pulses and the transmission of digital signals 01 ... in response to the (n+1)-th, the (n+2)-th ... clock pulses. The clock pulses are applied directly to the ring counter RC in FIG. 7, and the digital signals are applied to the input terminal 1a of the amplifier.

In response to the first through n-th clock pulses, the ring counter RC provides outputs $g_1, g_2, \ldots$ and $g_n$, so that the FET switches $FETSW_1$ through $FETSW_n$ are successively closed (rendered conductive), as a result of which the output voltage of the amplifier 1 is connected to the diodes $D_1, D_2, \ldots$ and $D_n$ of the laser diode array 4 one after another. For instance, the digital signal corresponding to the first clock pulse is applied to the diode $D_1$, and the digital signal corresponding to the n-th clock pulse is applied to the diode $D_n$.

FIG. 12 shows an image that appears in the phosphor screen of the streak tube 10 while $(m \times n)$ clock pulses are produced. It is assumed that the clock frequency is 2 GHz (the clock interval being 500 picoseconds) and the number of laser diodes is 100. In this case, one cycle of operation of the switch circuits is achieved in 50 nano-seconds ($=500 \times 10^{-12} \times 100$). That is, the horizontal length of the streak image corresponds to 50 nano-seconds, including 100 clock pulses.

If the streak sweep is carried out in such a manner that $(50 \times m)$ nano-seconds corresponds to the vertical length of the streak image, then the observation time is 10 micro-seconds with $m=200$. The 10 microseconds correspond to 20,000 clock pulses; that is, with one streak image 20,000 continuous binary signals 2 GHz in maximum density can be observed. The streak image can be picked up with a high sensitivity television camera for analysis.

In this case, binary signals are handled as described above, and therefore the signals can be processed at high speed and with high density when compared with the above-described case where analog data are handled.

In this invention, a streak camera is employed as a sweeping device for sweeping a light from a diode array at a high speed and forming an image corresponding to the variation in intensity of the light. However, in place of the streak camera, a device capable of sweeping the light at the substantially same speed as the streak camera may be employed in this invention.

As was described above, the electrical signal observing device according to the invention comprises the light emitting element group including a plurality of light emitting elements and the electrical signal connecting means for connecting an electrical signal to the light emitting elements one after another for a period of time for measurement in such a manner that the electrical signal is time-divided into a plurality of cycles of an electrical signal. Each cycle of the electrical signal is further time-divided into electrical signal parts the number of which is equal to that of the light emitting elements and which are successively applied to the light emitting elements, respectively. The streak camera has a sweep time corresponding to the period of time for measurement, and the emitted-light connecting means and the light emitting elements of the light emitting element group output in each cycle of light emission in a direction perpendicular to the direction of the sweep of the streak camera. Accordingly, with the electrical signal observing device of the invention a high speed analog or binary signal can be measured with high time resolution and for a relatively long period of time. The electrical signal observing means of the present invention can be used in the fields of ultra high-speed devices and ICs and in ultra high-speed original processing and communications.

What is claimed is:

1. An electrical signal observing device comprising:
a light emitting element group including a plurality of light emitting elements;
electrical signal connecting means for connecting an electrical signal to said light emitting elements in said light emitting element group for a period of time for measurement in such a manner that said electrical signal is time-divided into a plurality of cycles of electrical signal, and each cycle of electrical signal is further time-divided into a plurality of electrical signal parts equal in number to said light emitting elements in said light emitting element group and being successively applied to respective ones of said light emitting elements;
a sweeping means for performing a sweeping operation with a sweep time corresponding to said period of time for measurement; and
emitted-light connecting means for arranging outputs of said light emitting elements of said light emitting element group in each cycle of light emission in a direction perpendicular to the direction of sweep of said sweeping means.

2. An electrical signal observing device according to claim 1, wherein said light emitting element group comprises a light emitting element array including a plurality of light emitting elements arranged in a straight line, and said emitted-light connecting means comprises optical means for forming an elongated image of said light emitting element array in a direction perpendicular to the direction of the sweep of said sweeping means.

3. An electrical signal observing device according to claim 1, wherein said light emitting element group includes a light emitting element array comprising a plurality of light emitting elements arranged in a straight line, and said emitted-light connecting means comprises optical means for forming an elongated image in a direction perpendicular to the direction of sweep of said sweeping means, and slit means disposed in front of said sweeping means for thinning said elongated image.

4. An electrical signal observing device according to claim 1, wherein said electrical signal connecting means comprises change-over switch means.

5. An electrical signal observing device according to claim 1, further including sweep voltage means for performing the sweeping operation of said sweeping means by means of a ramp voltage.

6. An electrical signal observing device according to claim 1, wherein said electrical signal to be measured changes repeatedly in the same manner, and wherein said device further includes sweep voltage means for performing a repetitive sweeping operations of said sweeping means synchronously with said repetition.

7. An electrical signal observing device according to claim 1, wherein said light emitting element group comprises a plurality of laser diodes.

8. An electrical signal observing device according to claim 1, wherein said electrical signal connecting means includes optical control type switches.

9. An electrical signal observing device according to claim 1, wherein said sweeping means comprises a streak camera.

10. An electrical signal observing device comprising:
a light emitting element group including n light emitting elements where n is an integer;
electrical signal connecting means for providing an electrical signal to said light emitting elements in said light emitting element group for a period of time for measurement in such a manner that said electrical signal is time-divided into m cycles of said electrical signal, where m is an integer, said period of time for measurement comprising said m cycles of said electrical signal wherein each cycle of said electrical signal is further time-divided into electrical signal parts corresponding to n time slots that are successively applied to respective ones of said light emitting elements;
a sweeping means for performing a sweep operation with a sweep time corresponding to said period of time for measurement; and
emitted-light connecting means for arranging outputs of said light emitting elements of said light emitting element group in each cycle of light emission in a direction perpendicular to the direction of sweep of said sweeping means.

11. An electrical signal observing device according to claim 10, wherein said light emitting element group comprises a light emitting element array including a plurality of light emitting elements arranged in a row, and wherein said emitted-light connecting means comprises optical means for forming an elongated image of said light emitting element array in a direction perpendicular to the direction of the sweep of said sweeping means.

12. An electrical signal observing device according to claim 10, wherein said sweeping means comprises a streak camera.

13. An electrical signal observing device comprising:
a light emitting element group including a plurality of light emitting elements;
electrical signal connecting means for connecting an electrical signal to said light emitting elements in said light emitting element group for a period of time for measurement in such a manner that said electrical signal is time-divided into a plurality of cycles and each cycle is further time-divided into a plurality of electrical signal parts equal in number to said light emitting elements in said light emitting element group and being successively applied to respective ones of said light emitting elements;
sweeping means for performing a sweeping operation with a sweep time corresponding to said period of time for measurement; and
emitted-light connecting means for arranging outputs of said light emitting elements of said light emitting element group in each cycle of light emission in a direction perpendicular to the direction of sweep of said sweeping means, said light emitting element group including a light emitting element array comprising a plurality of light emitting elements arranged in a straight line, and said emitted-light connecting means comprising a slit board arranged on the light emission side of said light emitting element array and having a slit therethrough for transmitting light, and optical means for forming an elongated image of the slit of said slit board in a direction perpendicular to the direction of sweep of said sweeping means.

14. An electrical signal observing device comprising:
a light emitting element group including a plurality of light emitting elements;
electrical signal connecting means for connecting an electrical signal to said light emitting elements in said light emitting element group for a period of time for measurement in such a manner that said electrical signal is time-divided into a plurality of cycles and each cycle is further time-divided into a plurality of electrical signal parts equal in number to said light emitting elements in said light emitting element group and being successively applied to respective ones of said light emitting elements;
sweeping means for performing a sweeping operation with a sweep time corresponding to said period of time for measurement; and
emitted-light connecting means for arranging outputs of said light emitting elements of said light emitting element group in each cycle of light emission in a direction perpendicular to the direction of sweep of said sweeping means, said light emitting element group comprising a plurality of light emitting elements, and said emitted-light connecting means comprising fibers for transmitting outputs of said light emitting elements, and connecting means for arranging the output ends of said fibers in a direction perpendicular to the direction of sweep of said sweeping means.

15. An electrical signal observing device comprising:
a light emitting element group including a plurality of light emitting elements;
electrical signal connecting means for connecting an electrical signal to said light emitting elements in said light emitting element group for a period of time for measurement in such a manner that said electrical signal is time-divided into a plurality of cycles and each cycle is further time-divided into a plurality of electrical signal parts equal in number to said light emitting elements in said light emitting element group and being successively applied to respective ones of said light emitting elements;
sweeping means for performing a sweeping operation with a sweep time corresponding to said period of time for measurement; and
emitted-light connecting means for arranging outputs of said light emitting elements of said light emitting element group in each cycle of light emission in a direction perpendicular to the direction of sweep of said sweeping means, said electrical signal connecting means including a group of switching elements provided in correspondence to said light emitting elements.

16. An electrical signal observing device according to claim 15, wherein said switching elements are ultra-high speed GaAs switching elements.

17. An electrical signal observing device comprising:
a light emitting element group including a plurality of light emitting elements;
electrical signal connecting means for connecting an electrical signal to said light emitting elements in said light emitting element group for a period of time for measurement in such a manner that said electrical signal is time-divided into a plurality of electrical parts equal in number to said light emitting elements in said light emitting group and being successively applied to respective ones of said light emitting elements;

sweeping means for performing a sweeping operation with a sweep time corresponding to said period of time for measurement; and emitted-light connecting means for arranging outputs of said light emitting elements of said light emitting group in each cycle of light emission in a direction perpendicular to the direction of sweep of said sweeping means, said electrical signal connecting means and said light emitting element group comprising an amplifier for amplifying said electrical signal to be measured, a plurality of switching elements for distributing an output of said amplifier, and a plurality of laser diodes connected to corresponding ones of said plurality of switching elements.

18. An electrical signal observing device according to claim 17, wherein said electrical signal connecting means includes a counter for controlling said switching elements.

19. An electrical signal observing device according to claim 17, wherein said electrical signal connecting mean includes a strip line for supplying a pulse voltage successively to each of said switching elements.

20. An electrical signal observing device according to claim 17, wherein said electrical signal connecting means includes a distributed constant circuit for controlling said switching elements.

21. An electrical signal observing device comprising:

a light emitting element group including n light emitting elements, where n is an integer;

electrical signal connecting means for providing an electrical signal to said light emitting elements in said light emitting element group for a period of time for measurement in such a manner that said electrical signal is time-divided into m cycles, where m is an integer, said period of time for measurement comprising said m cycles of said electrical signal wherein each cycle of said electrical signal is further time-divided into electrical signal parts corresponding to n time slots that are successively applied to respective ones of said light emitting elements;

sweeping means for performing a sweep operation with a sweep time corresponding to said period of time for measurement; and emitted-light connecting means for arranging outputs of said light emitting elements of said light emitting element group in each cycle of light emission in a direction perpendicular to the direction of sweep of said sweeping means, said light emitting elements comprising a plurality of light emitting diodes and said emitted-light connecting means comprising a plurality of corresponding optical fibers having output ends and means for supporting said output ends in a direction perpendicular to the direction of the sweep of said sweeping means.

22. An electrical signal observing device according to claim 21, wherein said electrical signal connecting means comprises a plurality of high-speed switching elements for successively connecting corresponding ones of said high-speed switching elements to a source of the electrical signal to be observed.

* * * * *